United States Patent [19]
Hsiao

[11] Patent Number: 5,946,574
[45] Date of Patent: Aug. 31, 1999

[54] METHOD FOR FORMING A DIODE PROTECTION CIRCUIT CONNECTING TO MOS DEVICE

[75] Inventor: Chih-Yuan Hsiao, Feng-Shan, Taiwan

[73] Assignee: United Microelectronics Corp., Hsinchu, Taiwan

[21] Appl. No.: 09/218,540

[22] Filed: Dec. 22, 1998

[51] Int. Cl.[6] .................................................. H01L 21/8234
[52] U.S. Cl. .......................... 438/275; 438/199; 438/200; 438/229; 257/328; 257/355; 257/356; 257/357
[58] Field of Search .................................... 257/328, 355, 257/356, 357; 438/275, 200, 199, 229, 168, 216, 217, 218, 211

[56] References Cited

U.S. PATENT DOCUMENTS 5,516,717  5/1996  Hsu .
5,591,661  1/1997  Shiota .

Primary Examiner—Peter Toby Brown
Assistant Examiner—Long Pham
Attorney, Agent, or Firm—Hickman Stephens & Coleman

[57] ABSTRACT

A method for forming a protection circuit that starts with forming a first-type well and a second-type well on a first-type substrate. By forming isolations, a first active region is defined within the second-type well, and a second active region, a third active region and a fourth active region are defined within the first-type well. A first polysilicon layer is formed on the substrate and patterned to expose the third and the fourth active regions. A second polysilicon layer is formed on the substrate and patterned into a first gate that connects the first and the third active regions, and a second gate that connects the second and the fourth active regions. Then, by performing a first-type implantation process, the first gate is turned into a first-type gate. First-type source/drain regions are formed in the first active region, and first-type contacts are formed in the third active region as well. Similarly, the second gate is turned into a second-type gate, second-type source/drain regions are formed in the second active region, and second-type contacts are formed in the fourth active region by performing a second-type implantation process.

9 Claims, 5 Drawing Sheets

METHOD FOR FORMING A DIODE PROTECTION CIRCUIT CONNECTING TO MOS DEVICE

BACKGROUND OF THE INVENTION

1. Field of the Invention

This invention relates to a method for forming a semiconductor device, and more particularly, to a method for forming a protection circuit.

2. Description of Related Art

In order to protect a semiconductor device from the damages caused by electrical surge or over-stress charges, a protection containing a diode, a protection diode, is normally built next to the active region of the semiconductor device.

As shown in FIG. 1A, which illustrates a protection circuit for protecting a P-type metal-semiconductor-oxide (MOS) transistor, a protection diode 12 is connected to the gate of a P-type MOS transistor 10 at its P end, and grounded at its N end. In the case of that a negative input is fed at the input end, the connection to the P-type MOS transistor 10 is closed and the connection to the protection diode 22 is opened. Consequently, the input can go through the P-type MOS transistor 10. Whereas, in the case of that the input at the input end is positive, the connection to the P-type MOS transistor 10 is opened, and the connection to the protection diode 22 is closed. The input is bypassed by the protection diode 12 to prevent the gathering of positive charges at the gate of the P-type MOS transistor 10. Therefore, the gate oxide layer of the P-type MOS transistor 10 is protected from the positive charges gathering at the gate.

Similar to FIG. 1A, FIG. 1B illustrates a protection circuit for protecting a N-type metal-semiconductor-oxide (MOS) transistor. A protection diode 22 is connected to the gate of a N-type MOS transistor 20 at its N end, and grounded at its P end. In the case of that a positive input is fed at the input end, the connection to the N-type MOS transistor 20 is closed and the connection to the protection diode 22 is opened. Consequently, the input can go through the N-type MOS transistor 20. Whereas, in the case of that the input at the input end is negative, the connection to the N-type MOS transistor 20 is opened, and the connection to the protection diode is closed. The input is bypassed by the protection diode 22 to prevent the gathering of negative charges at the gate of the N-type MOS transistor 20. Therefore, the gate oxide layer of the N-type MOS transistor 20 is protected from the negative charges gathering at the gate.

A diode consists of attached N-type semiconductor and P-type semiconductor. Referring to FIG. 2, a semiconductor diode consists of a first-type doped region 30 formed in a second-type well 40. With an additional second-type substrate 50, the diode is able to bypass over-stress charges and voltage to protect a MOS transistor, wherein the first type is N-type and the second type is P-type, or vice versa. Regarding to the valid structure of a protection diode, two protection diodes, which are formed on a substrate with a uniformly electrical property, with different electrical properties can not provide protection to MOS transistors at the same time. Therefore, a conventional method for forming a protection diode can not provide sufficient protection to a dual gate device.

The top view of a conventional protection circuit of a semiconductor device is shown in FIG. 3. Referring to FIG. 3, an active region 110 and the doped region 120 of a protection diode are defined on a substrate 100. A doped polysilicon gate 105 on the active region 110 is connected to the doped region 120 of the protection diode through a metal line 130. The gate 105 is connected to the metal line 130 through a contact 125a, and the doped region 120 of the protection diode is connected to the metal line 130 through four contacts 125b. In the case of that the active region 110 contains a NMOS, the doped region 120 is N-type and formed in a P-well. On the other hand, in the case of that the active region 110 contains a PMOS, the doped region 120 is P-type and formed in a N-well.

The method for forming the foregoing protection circuit includes forming devices and protection diode on a substrate, depositing a dielectric layer to cover the foregoing devices, and forming contacts and metal layer to connect the gate and the protection diode. Since any plasma-related processes preformed before the formation of the metal layer also generate undesired charges gathering on the devices, the undesired charges can not be bypassed by the protection diode through the metal line 130. Therefore, the protection diode fails to prevent the damages on the devices before the formation of the metal line.

SUMMARY OF THE INVENTION

It is therefore an objective of the present invention to provide a method for forming a protection circuit that bypasses charges generated by fabrication processes through the protection diode to prevent devices from being damaged by the charges.

It is another an objective of the present invention to provide a method for forming a protection circuit that connects the gate of a MOS transistor to the protection circuit before performing any plasma-related processes.

It is still another objective ot the present invention to provide a method for forming a protection circuit that allows the co-existence of protection diodes with different electrical properties.

In accordance with the foregoing and other objectives of the present invention, the invention provides a method for forming a protection circuit that starts with forming a first-type well and a second-type well on a first-type substrate. By forming isolations, a first active region is defined within the second-type well, and a second active region, a third active region and a fourth active region are defined within the first-type well. A first polysilicon layer is formed on the substrate and patterned to expose the third and the fourth active regions. A second polysilicon layer is formed on the substrate and patterned into a first gate that connects the first and the third active regions, and a second gate that connects the second and the fourth active regions. Then, by performing a first-type implantation process, the first gate is turned into a first-type gate. First-type source/drain regions are formed in the first active region, and first-type contacts are formed in the third active region as well. Similarly, the second gate is turned into a second-type gate, second-type source/drain regions are formed in the second active region, and second-type contacts are formed in the fourth active region by performing a second-type implantation process.

BRIEF DESCRIPTION OF DRAWINGS

The invention can be more fully understood by reading the following detailed description of the preferred embodiments with reference made to the accompanying drawings, wherein.

DETAILED DESCRIPTION OF PREFERRED EMBODIMENTS

Figure 1A:
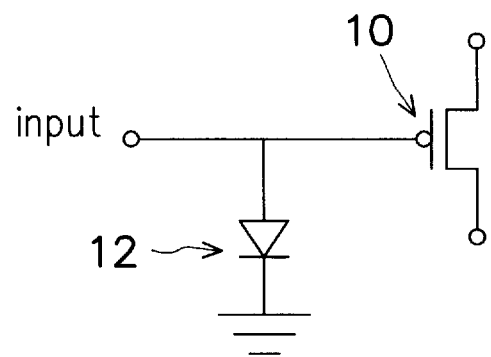
FIG. 1A is a schematic circuit diagram showing a conventional protection circuit of a P-type MOS transistor.
Figure 1B:
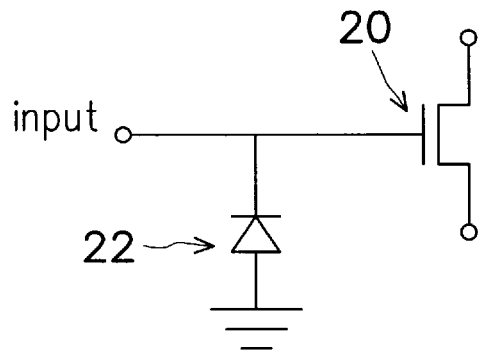
FIG. 1B is a schematic circuit diagram showing a conventional protection circuit of a N-type MOS transistor.
Figure 2:
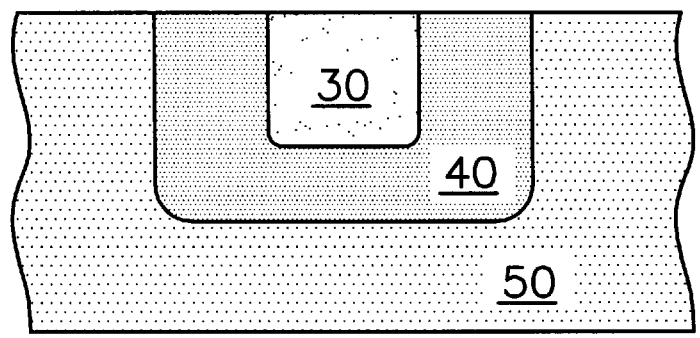
FIG. 2 is a schematic cross-sectional view showing a conventional semiconductor diode.
Figure 3:
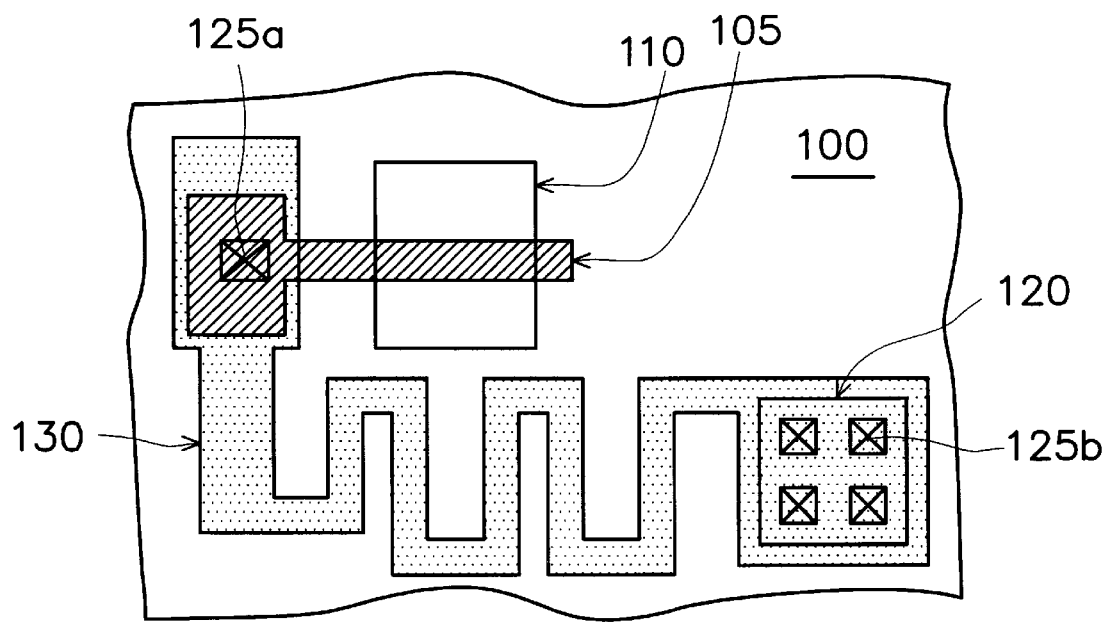
FIG. 3 is a schematic top-viewed diagram showing the layout of a conventional protection circuit.
Figure 4:
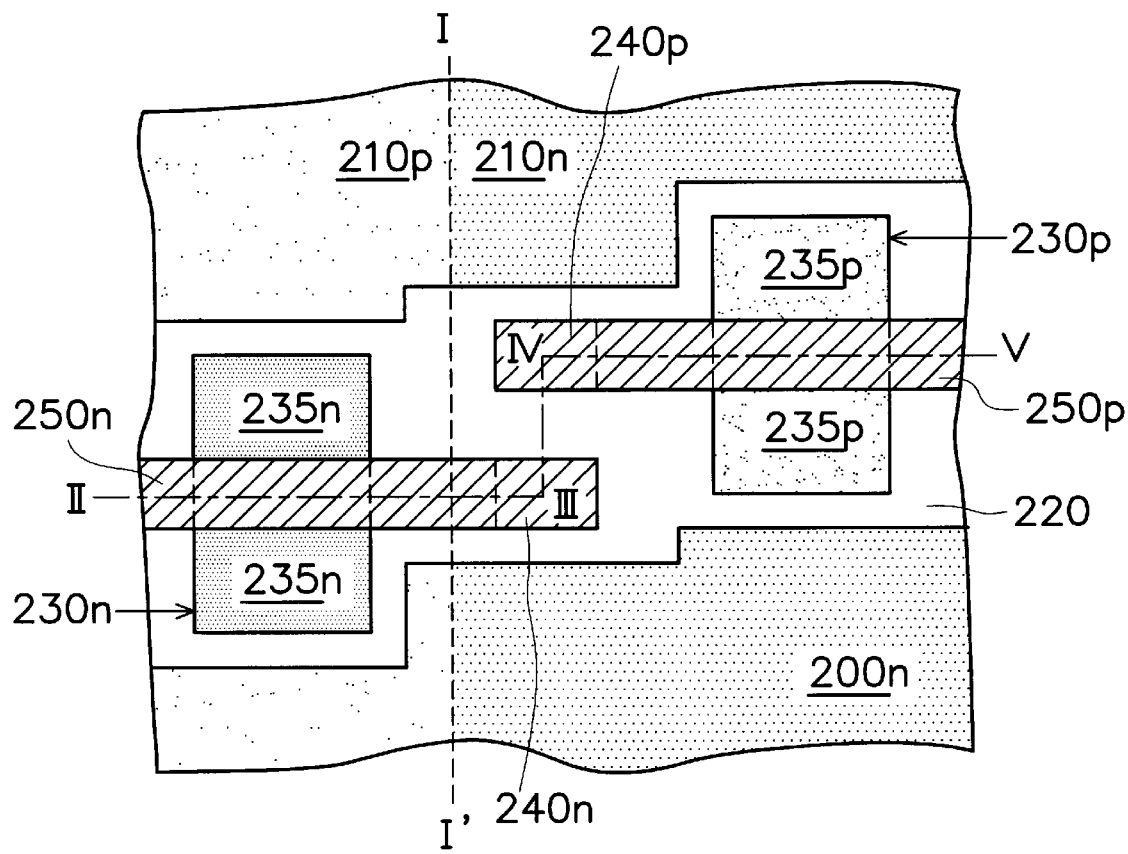
FIG. 4 is a schematic top-viewed diagram showing the layout of the protection circuit of a preferred embodiment according to the invention.

The invention provides a new method for forming a protection circuit that contains protection diodes of different electrical properties to provide protection to both N-type and P-type MOS transistors. The layout of the protection circuit of a preferred embodiment according to the invention is shown in FIG. 4. FIGS. 5A through 5F are cross-sectional views showing the fabrication process for forming a protection circuit of the invention.

Referring to FIG. 4. a substrate 200n of the first type is divided by a plane I, wherein the substrate 200n to the right of the plane I is a first-type well 210n, and the substrate 200n to the left of the plane I is a second-type well 210p. A first-type active region 230n, a second-type active region 230p, a first-type contact 240n, and a second-type contact 240p are surrounded by isolation 220. The first-type active region 230n is located within the second-type well 210p. The second-type active region 230p, the first-type contact 240n, and the second-type contact 240p are located within the first-type well 210n. A portion of first-type gate 250n, wherein the first-type gate 250n is sided by first-type source/drain regions 235n within the second-type active region 230n covers the first-type contact 240n. Similarly, a portion of a second-type gate 250p covers the second-type contact 240p, wherein the second-type gate 250p is sided by second-type source/drain regions 235p within the second-type active region 230p.

FIGS. 5A through 5F are schematic cross-sectional views showing the fabrication process of a protection circuit according to the invention along the II-III-IV-V planes.

Figure 5A:
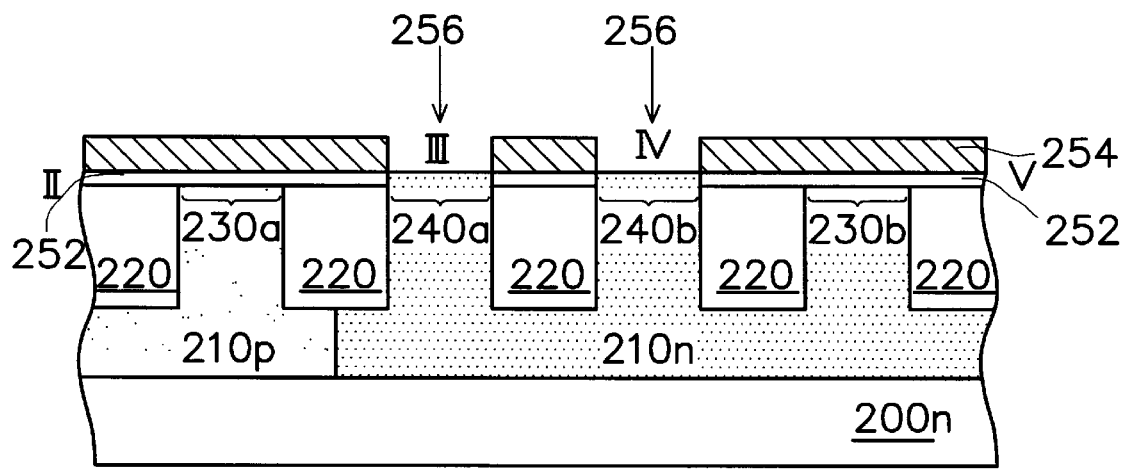
FIGS. 5A through 5F are schematic cross-sectional views showing the fabrication process for forming a protection circuit of a preferred embodiment according to the invention.

Referring to FIG. 5A, the first-type well 210n and the second-type well 210p are formed on the first-type substrate 200n. By forming isolation 220, active regions 230a, 230b, 240a, and 240b are defined, wherein the isolation 220 can be a shallow-trench isolation of silicon dioxide or other structure of different material capable of fulfilling the actual needs. A gate oxide layer 252 and a first polysilicon layer 254 are formed on the substrate 200n, and then patterned for forming openings 256 to expose the active regions 240a and 240b.

Figure 5B:
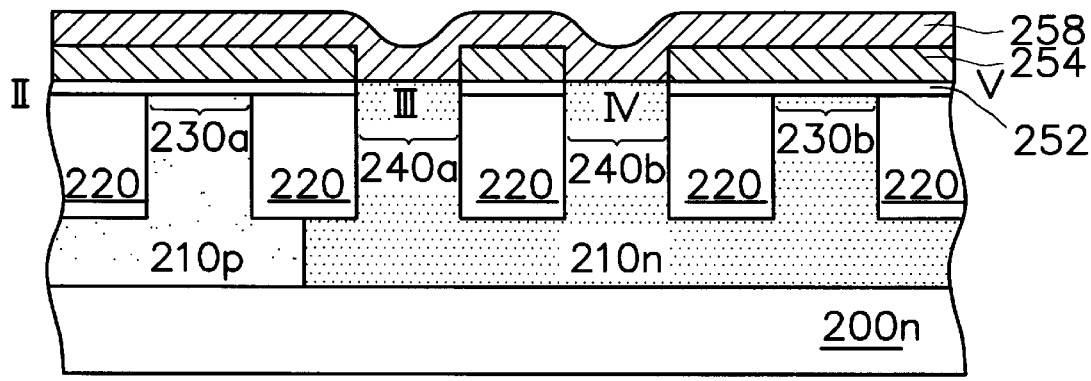
Figure 5C:
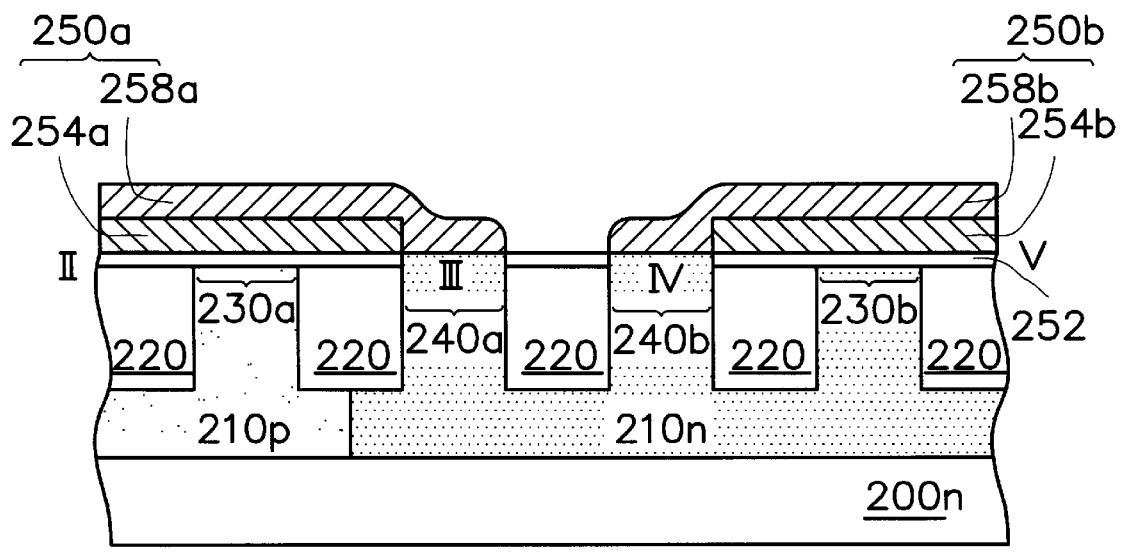

Referring next to FIG. 5B, a second polysilicon layer 258 is formed on the first polysilicon layer 254, wherein the second polysilicon layer 258 also fills the openings 256. By performing patterning processes on the second polysilicon layer 258 and the first polysilicon layer 254, as shown in FIG. 5C gate 250a and 250b are formed. The gate 250a is connected to the active regions 230a and 240a, and the gate 250b is connected to the active regions 230b and 240b.

Figure 5D:
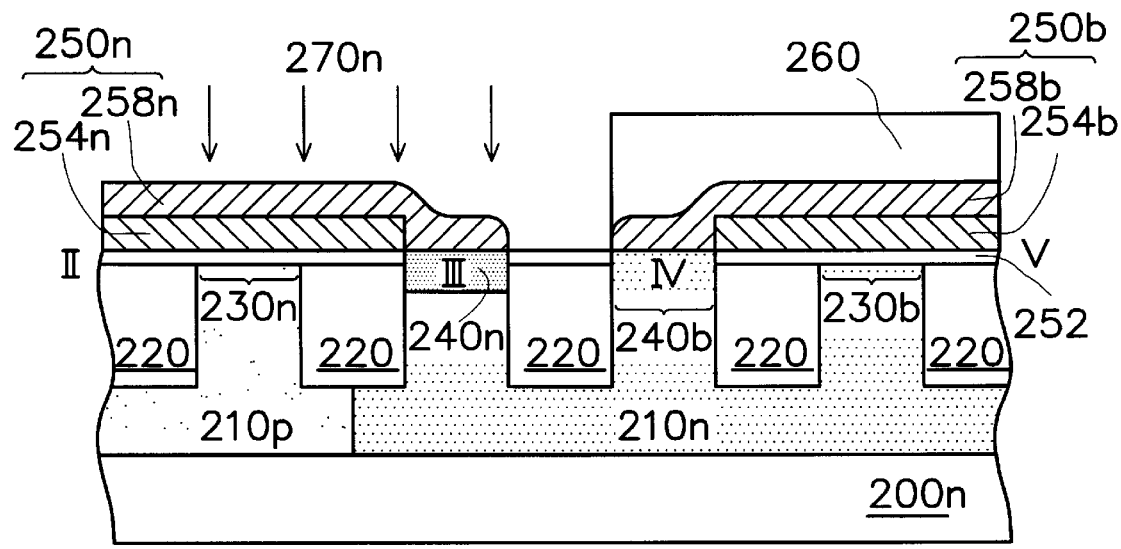

Referring to FIG. 5D together with FIG. 4, a photoresist layer 260 is formed on the substrate 200n for covering the active regions 230b and 240b, and the gate 250b. Then, an implantation process of the first type 270n is performed to first-type source/drain regions 235n, a first-type contact 240n, and a first-type gate 250n. So far, the protection circuit for the first-type MOS is done after the foregoing processes. Any abnormally gathered charges due to implantation processes is bypassed through the first-type gate 250n, which is grounded to the substrate 200n through contact of the first type 240n.

Figure 5E:
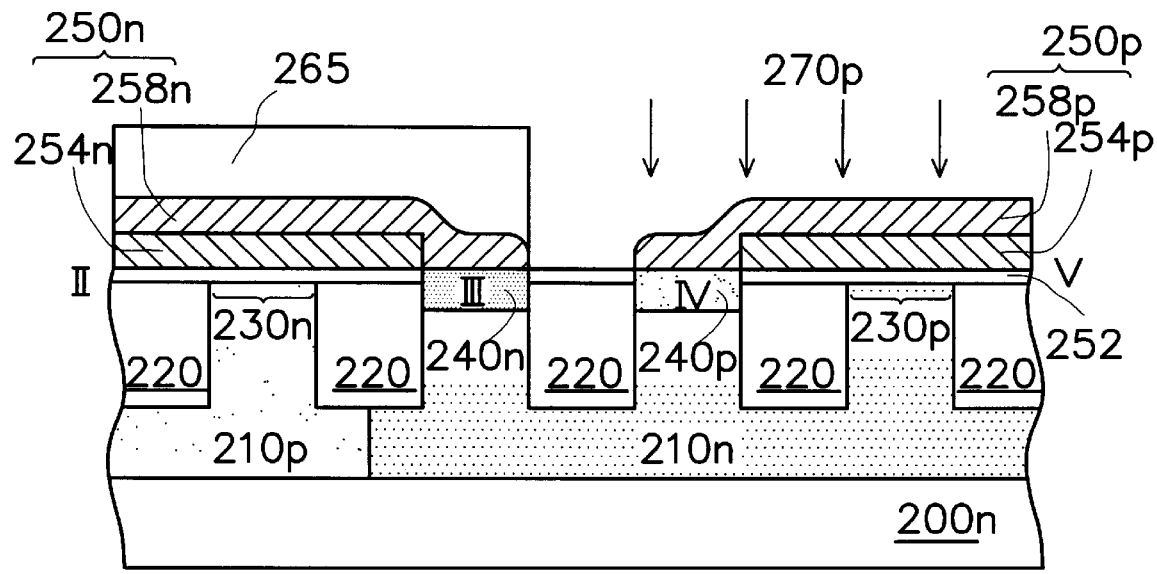
Figure 5F:
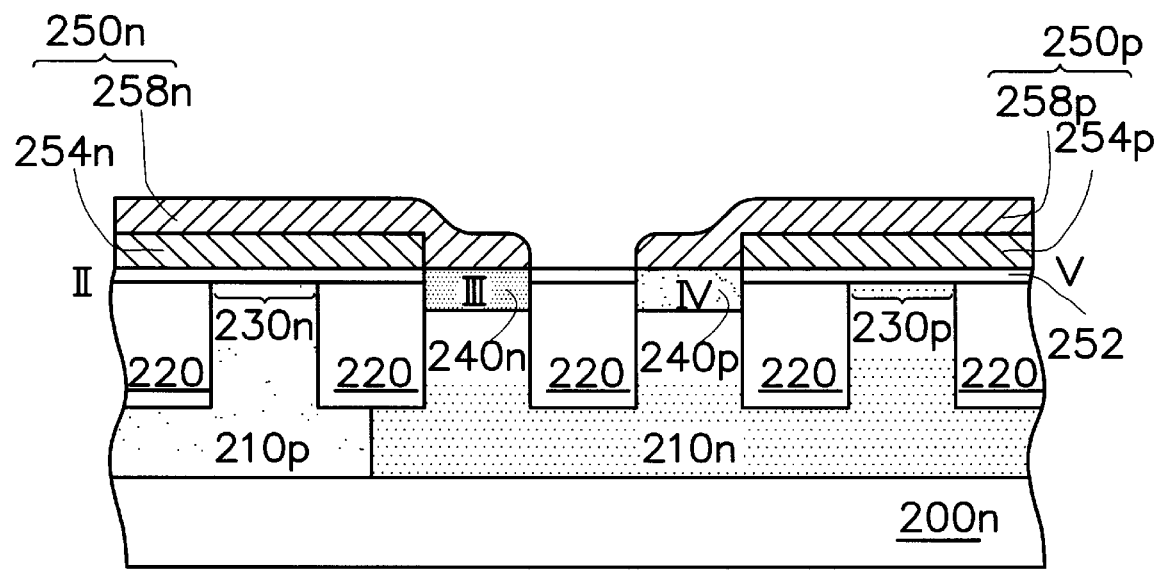

Referring to FIG. 5E together with FIG. 4, a photoresist layer 265 is formed to cover the first-type source/drain regions 235n, the first-type contact 240n, and the first-type gate 250n after the photoresist layer 260 is removed. Similarly to the previous step, an implantation process 270p of the second type is performed to formed second-type source/drain regions 235p, a second-type contact 240p, and a second-type gate 250p. Then, the photoresist layer 265 is removed to finish the formation of the protection circuit for a second-type MOS, as shown in FIG. 5F. Any abnormally gathered charges due to implantation processes is bypassed through the second-type gate 250p, which is grounded to the substrate 200n through contact of the second type 240p.

The foregoing protection circuit of the first-type MOS includes a first-type doped region, a first-type well, and a first-type substrate, and on the other hand, the protection circuit of the second-type MOS includes a second-type doped region, a first-type well, and a first-type substrate. In the case of that the first type is N type, the second type is P type. Whereas, in the case of that the first type is P type, then the second type is N type. The protection circuit formed by the method of the invention is capable of providing protection to the MOS devices in both cases.

In accordance with the foregoing, the method of the invention is advantaged on:

1. providing protection to MOS devices during the fabrication process by forming the gate and the connection of the protection circuit at the same time before any implantation processes are performed, therefore, even the charges generated by the follow-up implantation process during the fabrication process can be bypassed by the protection circuit; and 2. forming protection circuits for different kinds of MOS devices on a same substrate to provide protection to a device The invention has been described using exemplary preferred embodiments. However, it is to he understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a protection circuit of a metal-oxide-semiconductor (MOS) device on a first-type substrate, wherein the first-type substrate comprises a first-type well and a second-type well, the method comprising:

forming an isolation to define a first active region within the second-type well, and define a second active region, a third active region, and a fourth active region within the first-type well;

forming a gate oxide layer on the first-type substrate;

forming a first polysilicon layer on the gate oxide layer;

patterning the first polysilicon layer and the gate oxide layer to expose the third active region and the fourth active region;

forming a second polysilicon layer on the first substrate;

patterning the first polysilicon layer, the second polysilicon layer, and the gate oxide layer to form a first gate and a second gate, wherein the first gate connects the first active region and the third active region, and the second gate connects the second active region and the fourth region, and wherein the first gate exposes a portion of the first active region, and the second gate exposes a portion of the second active region;

performing a first-type implantation process to convert the first gate into a first-type gate, to convert the exposed portion of the first active region into a plurality of first-type source/drain regions, and to convert the third active region into a first-type contact; and performing a second-type implantation process to convert the second gate into a first second-type gate, to convert the exposed portion of the second active region into a plurality of second-type source/drain regions, and to convert the fourth active region into a first second-type contact.

2. The method of claim 1, wherein the first-type is N-type, and the second-type is P-type.

3. The method of claim 1, wherein the first-type is P-type, and the second-type is N-type.

4. A method for forming a protection circuit on a first-type substrate, wherein the first-type substrate comprises a first-type well, the method comprising:

forming an isolation to define a first active region and a second active region within the first-type well;

forming a gate oxide layer on the first-type substrate;

forming a first polysilicon layer on the gate oxide layer;

patterning the first polysilicon layer and the gate oxide layer to expose the second active region;

forming a second polysilicon layer on the first substrate;

patterning the first polysilicon layer, the second polysilicon layer, and the gate oxide layer to form a gate, wherein the gate connects the first active region and the second active region, and wherein the gate exposes a portion of the first active region;

performing a second-type implantation process to convert the gate into a second-type gate, to convert the exposed portion of the first active region into a plurality of second-type source/drain regions, and to convert the second active region into a second-type contact.

5. The method of claim 4, wherein the first-type is N-type, and the second-type is P-type.

6. The method of claim 4, wherein the first-type is P-type, and the second-type is N-type.

7. A method for forming a protection circuit on a first-type substrate, wherein the first-type substrate comprises a first-type well and a second-type well, the method comprising:

forming an isolation to define a first active region within the second-type well, and define a second active region within the first-type well;

forming a gate oxide layer on the first-type substrate;

forming a first polysilicon layer on the gate oxide layer;

patterning the first polysilicon layer and the gate oxide layer to expose the second active region;

forming a second polysilicon layer on the first substrate;

patterning the first polysilicon layer, the second polysilicon layer, and the gate oxide layer to form a gate, wherein the gate connects the first active region and the second active region, and wherein the gate exposes a portion of the first active region; performing a first-type implantation process to convert the gate into a first-type gate, to convert the exposed portion ot the first active region into a plurality of first-type source/drain regions, and to convert the second active region into a first-type contact.

8. The method of claim 7, wherein the first-type is N-type, and the second-type is P-type.

9. The method of claim 7, wherein the first-type is P-type, and the second-type is N-type.

\* \* \* \* \*